United States Patent
Komori et al.

(10) Patent No.: US 10,306,191 B2
(45) Date of Patent: May 28, 2019

(54) SYSTEM AND METHOD FOR HIGH DYNAMIC RANGE IMAGE SENSING

(71) Applicant: Cista System Corp., Grand Cayman (KY)

(72) Inventors: Hirofumi Komori, San Jose, CA (US); Dennis Tunglin Lee, San Jose, CA (US); Guangbin Zhang, Cupertino, CA (US); Jingzhou Zhang, Santa Clara, CA (US)

(73) Assignee: Cista System Corp., Grand Cayman (KY)

(*) Notice: Subject to any disclaimer, the term of this patent is extended or adjusted under 35 U.S.C. 154(b) by 0 days.

(21) Appl. No.: 15/363,873

(22) Filed: Nov. 29, 2016

(65) Prior Publication Data

US 2018/0152677 A1    May 31, 2018

(51) Int. Cl.
*H04N 9/04* (2006.01)
*H04N 5/378* (2011.01)
*H04N 5/355* (2011.01)
*H04N 5/3745* (2011.01)
*H01L 27/146* (2006.01)
*G06T 3/40* (2006.01)

(52) U.S. Cl.
CPC ........... *H04N 9/045* (2013.01); *G06T 3/4015* (2013.01); *H01L 27/14612* (2013.01); *H01L 27/14621* (2013.01); *H01L 27/14627* (2013.01); *H01L 27/14636* (2013.01); *H01L 27/14645* (2013.01); *H04N 5/35563* (2013.01); *H04N 5/378* (2013.01); *H04N 5/37457* (2013.01)

(58) Field of Classification Search
CPC ...... H04N 9/045; H04N 5/232; H04N 5/3355; H04N 5/347; H04N 2209/043
USPC ...... 348/277, 280, 270, 268, 273; 250/208.1
See application file for complete search history.

(56) References Cited

U.S. PATENT DOCUMENTS

| | | | | |
|---|---|---|---|---|
| 2007/0285526 A1* | 12/2007 | Mann | .................. | H04N 5/23245 348/222.1 |
| 2008/0211945 A1* | 9/2008 | Hong | .................. | H04N 5/35563 348/294 |
| 2009/0195681 A1* | 8/2009 | Compton | ........... | H04N 5/23245 348/308 |
| 2010/0013969 A1* | 1/2010 | Ui | ....................... | H04N 5/35545 348/294 |
| 2012/0281111 A1* | 11/2012 | Jo | .......................... | H04N 5/217 348/229.1 |
| 2014/0218567 A1* | 8/2014 | Han | ...................... | H04N 5/2353 348/239 |
| 2015/0163423 A1* | 6/2015 | Yin | ...................... | H04N 5/3591 348/295 |

* cited by examiner

*Primary Examiner* — Xi Wang
(74) *Attorney, Agent, or Firm* — Sheppard Mullin Richter & Hampton LLP

(57) ABSTRACT

A high dynamic range sensing device is disclosed. The device may comprise an array of Bayer-pattern units of color filters, each of the color filters corresponding to a pixel of the sensing device, and each of the color filters overlapping with a plurality of photodiodes.

17 Claims, 14 Drawing Sheets

SYSTEM AND METHOD FOR HIGH DYNAMIC RANGE IMAGE SENSING

TECHNICAL FIELD

The present application relates to the technical field of image sensor, and more particularly, to high dynamic range (HDR) sensing.

BACKGROUND

Charge-coupled device (CCD) sensors and Complementary Metal-Oxide Semiconductor (CMOS) sensors are commonly used for imaging, of which the dynamic range is an important performance indicator. The dynamic range can be defined as the ratio of the highest illuminance to the lowest illuminance that an image sensor can measure with an acceptable output quality. HDR images usually appear crisper and richer than normal images, because of better retention of highlight and shadow details.

Some current technologies produce each HDR image by taking multiple shots of various exposure times and combining features from each shot. Such process may take a few seconds and is prone to motion artifacts caused by movements. Thus, it is desirable to improve the dynamic range and image quality through innovations in the sensor architecture.

SUMMARY

One aspect of the present disclosure is directed to a high dynamic range sensing device. The device comprises an array of Bayer-pattern units of color filters, each of the color filters corresponding to a pixel of the sensing device, and each of the color filters overlapping with a plurality of photodiodes. In one embodiment, each of the color filters overlaps with four photodiodes. In another embodiment, each photodiode is associated with an integration time.

Another aspect of the present disclosure is directed to a high dynamic range sensing device. The sensing device comprises an array of Bayer-pattern units of color filters, each of the color filters corresponding to a pixel of the sensing device, each pixel having a plurality of photodiodes. In one embodiment, the each pixel includes four photodiodes. In another embodiment, each photodiode is associated with an integration time.

Another aspect of the present disclosure is directed to a high dynamic range sensing method. The method may comprise filtering photons through an array of Bayer-pattern units of color filters, each of the color filters corresponding to a pixel of the sensing device, and each of the color filters overlapping with a plurality of photodiodes; collecting the filtered photons at the plurality of photodiodes.

Another aspect of the present disclosure is directed to a high dynamic range sensing system. The system may comprise an array of Bayer-pattern units of color filters, each of the color filters corresponding to a pixel of the sensing device. The system may further comprise, for each pixel and associated color filter, a plurality of micro lenses each disposed above the color filter and each configured to direct photons to pass the filter, a plurality of photodiodes each disposed below the color filter and each configured to correspondingly receive the photons directed by the plurality of micro lenses and filtered through the color filter, and a circuit coupled to the plurality of photodiodes and configured to control the integration times of the plurality of photodiodes.

Additional features and advantages of the present disclosure will be set forth in part in the following detailed description, and in part will be obvious from the description, or may be learned by practice of the present disclosure. The features and advantages of the present disclosure will be realized and attained by means of the elements and combinations particularly pointed out in the appended claims.

It is to be understood that the foregoing general description and the following detailed description are exemplary and explanatory only, and are not restrictive of the invention, as claimed.

BRIEF DESCRIPTION OF THE DRAWINGS

The accompanying drawings, which constitute a part of this specification, illustrate several embodiments and, together with the description, serve to explain the disclosed principles.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present disclosure do not represent all implementations. Instead, they are merely examples of systems and methods consistent with aspects related to the invention as recited in the appended claims.

Figures 1A, 1B:
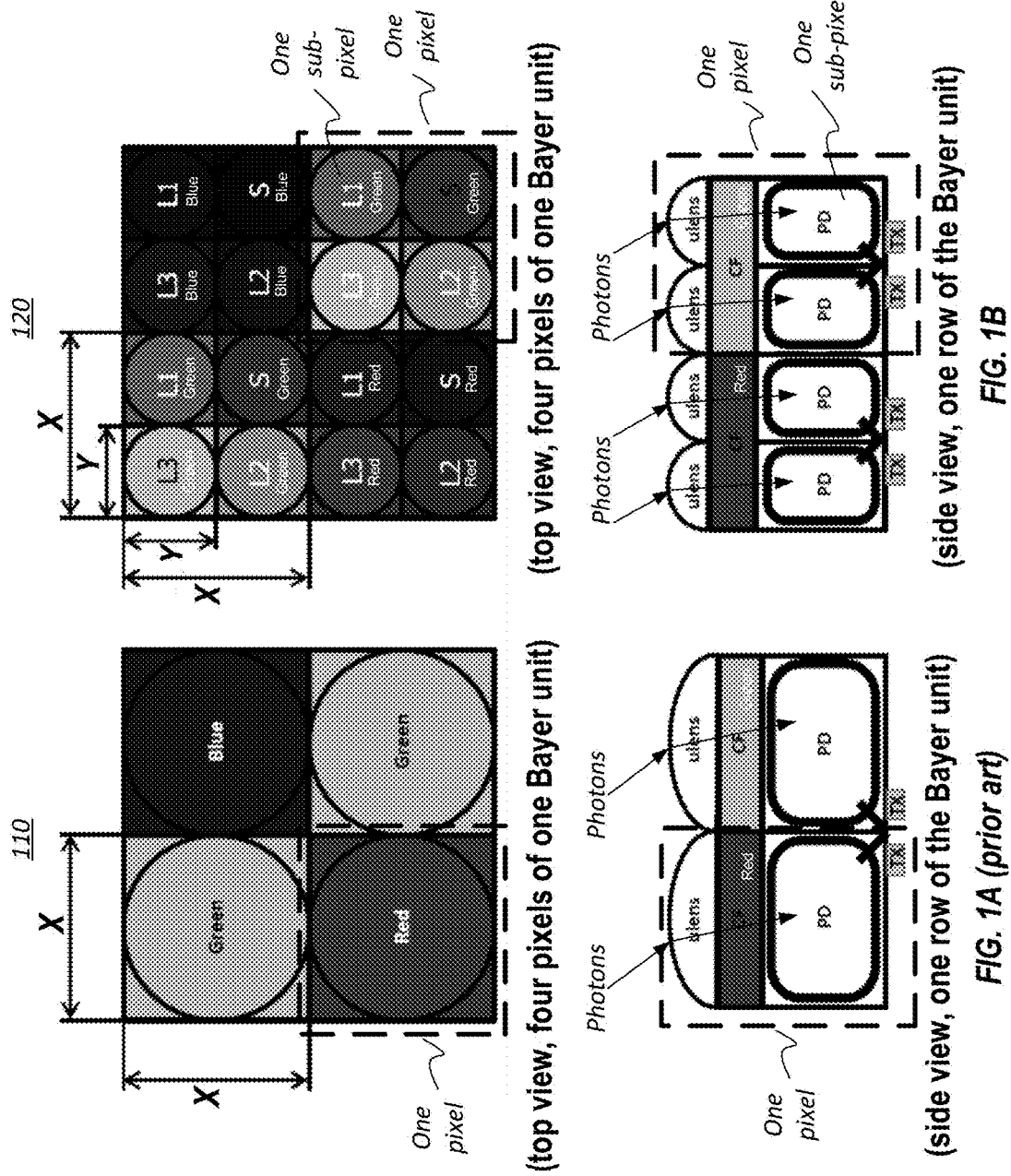
FIG. 1A is a graphical representation illustrating a Bayer unit of a sensor in prior art from both top and side views.
FIG. 1B is a graphical representation illustrating a Bayer unit of a Quadrant Pixel HDR sensor from both top and side views, consistent with exemplary embodiments of the present disclosure.

FIG. 1A is a graphical representation 110 illustrating a Bayer unit of a solid-state sensor in prior art from both top and side views. The solid-state (e.g., CCD, CMOS) sensor is the most common type of sensor: Bayer filter sensor. Such sensor comprises a color filter array arranged on top of a square grid of photodiodes to select red, green, or blue light. From the top view, the four pixels of a Bayer unit are shown as four squares, associated with two green filter across, a red filter, and a blue filter. Each pixel or filter may have identical dimensions of width X. A typical value for width X is 3.0 μm. Each square comprises a circle representing a micro lens (μlens). As shown in the side view, each color filter (CF) has a μlens disposed above and a photodiode (PD) disposed below.

FIG. 1B is a graphical representation 120 illustrating a Bayer unit of a Quadrant Pixel HDR sensor from both top and side views, consistent with exemplary embodiments of the present disclosure. Graphical representation 120 shows the four pixels each of width X, the four pixels forming the Bayer unit. The four pixels may also comprise two green filters across, a blue filter, and a red filter respectively. Each pixel may comprise multiple sub-pixels of width Y. In this figure, each pixel of width X comprises four sub-pixels of width Y. Each sub-pixel corresponds to a photodiode. Each photodiode is coupled to a switch, for example a transistor, in a specific example, a charge transferring (TX) transistor, which regulates an integration time of the photodiode. These sub-pixels form a four by four checkerboard pattern in FIG. 1B.

From the top view, corresponding to the four pixels in this Bayer unit, four filters each of width X are shown. Two of the filters across are green, one is red, and the other is blue. Each pixel is subdivided into four sub-pixels each of width Y and labeled as L3, L2, L1, or S. Width Y and width X can have various lengths. An exemplary length for Y is 1.5 μm, and an exemplary length for X is 3 μm. Each of the sub-pixels comprises a μlens represented by a circle.

Correspondingly shown in the side view, each sub-pixel has a μlens disposed above the filter and a photodiode disposed below the filter. When light impinges on the sensor, the μlens directs the light/photons to pass through the filter and then to the photodiode, which generates charges (e.g., electrons and holes) in response to the light exposure. Movement of such charges creates a current. To measure how much light hits the sensor, the current is to be measured. The currents produced by the photoconversion are typically very small, which discourages an accurate direct measurement. Thus, integration is used by setting the voltage across the photodiode to a known potential, and using the photodiode to collect photons for a period of time before the voltage is read out. Longer integration time allows more charges to be converted. The TX transistor coupled to the photodiode is used to regulate the integration time of the photodiode. Each photodiode may be associated with a TX transistor. It is also possible that two or more photodiodes couple to and share the same TX transistor.

In this side view, two sub-pixels share a CF—two μlenses disposed above the filter and two photodiode disposed below the filter. Since the side view only shows one row of sub-pixels and each pixel has two rows by two columns of sub-pixels according to the top view, each pixel has one filter shared among the four sub-pixels. That is, in an exemplary 2×2 arrangement, each pixel has four μlenses above a shared filter, four photodiodes below the shared filter, and four TX transistors respectively coupled to the four photodiodes. This configuration gives the name of Quadrant Pixel sensor. Each μlens may be substantially aligned with its corresponding photodiode, such that most of the photons impinging on the μlens can be directed to pass the filter and be detected by the photodiode. FIG. 1B and in association with details described in FIG. 2B, FIG. 4, FIG. 6B, and/or FIG. 7 below disclose a HDR sensing system, consistent with exemplary embodiments of the present disclosure.

As discussed above, in some embodiments, each sub-pixel is connected to a TX transistor for regulating integration times. By this way, the sub-pixels are provided with individually-configurable differential effective integration time for generating HDR images with the sensor. The various integration times may be labeled as L3, L2, L1, or S. L3, L2, L1, or S may correspond to four different integration times from the longest to the shortest. Though FIG. 1B shows four sub-pixels with four integration times in each pixel, the number of sub-pixels in each pixel is not limited to four, and any two of the integration times corresponding to the sub-pixels in each pixel may be the same or different. Each of the integration times may be set in default, configured by users, or otherwise determined. Each of the integration times may also be automatically configured according to luminance conditions (e.g., a longer exposure time is configured for a dark condition). Two or more of the integration times may be the same. Further, any of the sub-pixels of the same pixel may be configured to have integration time L3, L2, L1, or S, or any integration time as configured, which should not be limited to the illustrations in figures herein. Integration times labels such L and S in this disclosure are merely exemplary. Also, in exemplary figures of this disclosure, the grey scale of each sub-pixel may indicate the corresponding level of integration times for illustration purposes. For example, L3 as having the longest integration time may appear much brighter than S having the shortest integration time. Again, the grey-scale illustration of integration times is merely exemplary and not tied to particular sub-pixels.

In some embodiments, since each sub-pixel's integration time can be individually controlled by the corresponding TX transistor, each pixel can capture and convert image signals corresponding to four integration times. The integration times may be the same or different. If the pixel has more individually controlled sub-pixels, the image signals captured can correspond to more different integration times. Thus, even in one sensor detection by the disclosed device, each pixel can capture multiple readings corresponding to different integration levels. Captured signals of short integration time may retain highlight detail (e.g., scenes with bright light) while captured signals of long integration time may retain shadow detail (e.g., scenes with low light). These signals can be combined to obtain images and are essential to achieve HDR imaging.

Some existing HDR imaging systems (known as exposure bracketing) capture multiple images with the image sensor, each image having a different exposure time. This capturing process may take tens of milli-seconds. In this case, performing HDR imaging by combining the captured images may generate undesirable motion artifacts. The disclosed system can capture multi-exposure-level images in one exposure detection. Since one detection takes much less times (e.g., under a few milli-seconds) than multiple detections (e.g., tens of milli-seconds), motion artifacts caused by movements can be minimized. In another word, the disclosed system can integrate the times-domain HDR function with minimized motion artifact and multiple integration times.

Similarly, each pixel can be divided into any number of sub-pixels of any shapes, and each sub-pixel can be individually controlled in terms of the integration time, thereby achieving multiple integration times within the same pixel.

Figure 2A:
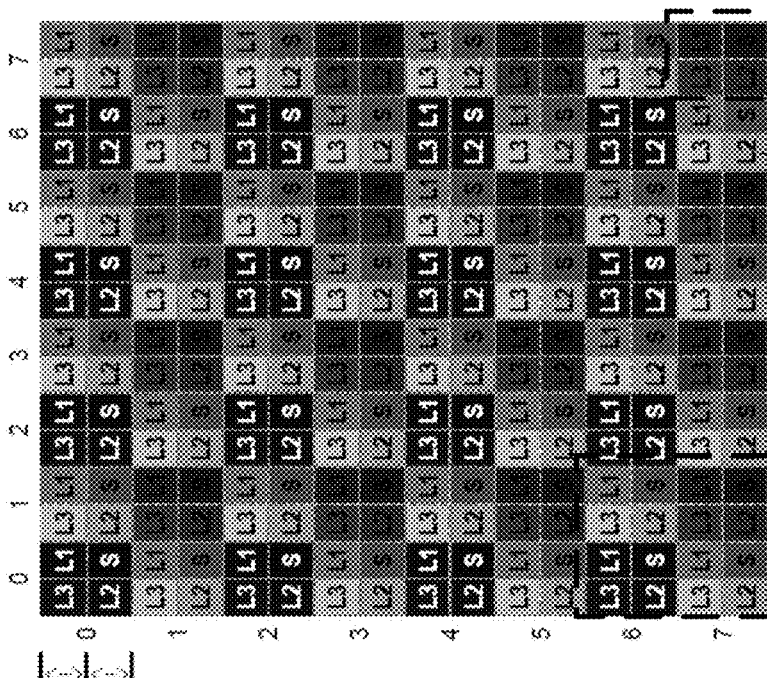
FIG. 2A is a graphical representation illustrating a visualized sensor pixel pattern in prior art.

FIG. 2A is a graphical representation 210 illustrating a visualized sensor pixel pattern in prior art. In this figure, 8 rows (labeled as 0 to 7) by 8 columns (labeled as 0 to 7) of 64 square pixels are shown. Similar to FIG. 1A discussed above, each pixel may have a width of X. In fact, representation 210 can be seen as an expansion based on multiplying representation 110 in rows and columns, forming a checker board of pixels. Each Bayer unit of FIG. 2A, consisting of four pixels, is assigned to an integration time: either L (long) or S (short). Every two neighboring Bayer units have different integration times. That is, as the Bayer unit of 2×2 four pixels in the top left corner are assigned to L, the next Bayer unit of 2×2 pixels in the same row or column are assigned to S, and so forth. However, since every pixel here has only one integration time, two Bayer units are required to capture the same image with two integration times, which reduces the image resolution compared to a similar normal sensor with a uniform integration time across all pixels.

Figure 2B:
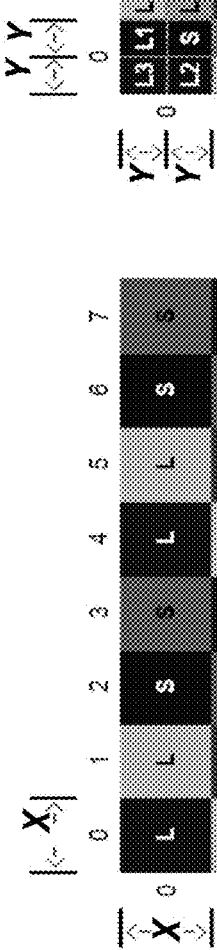
FIG. 2B is a graphical representation illustrating a visualized sensor pixel pattern with four integration times, consistent with exemplary embodiments of the present disclosure.

FIG. 2B is a graphical representation 220 illustrating a sensor pixel pattern of four integration times, consistent with exemplary embodiments of the present disclosure. In this figure, 8 rows (labeled as 0 to 7) by 8 columns (labeled as 0 to 7) of 64 square pixels are shown. Similar to FIG. 1B discussed above, each pixel may have a width of X=2Y, and each pixel may comprise four square sub-pixels of width Y. So there are a total of 256 sub-pixels shown in FIG. 2B.

As discussed above with reference to FIG. 1B, each of the sub-pixel can have an individual integration time L3, L2, L1, or S. By achieving integration time variations among sub-pixels of the same pixel rather than among multiple pixels, the resolution of the sensor shown in this figure is not reduced while obtaining HDR images, compared to a similar normal sensor with a uniform integration time across all pixels and with no subpixels.

Figure 3:
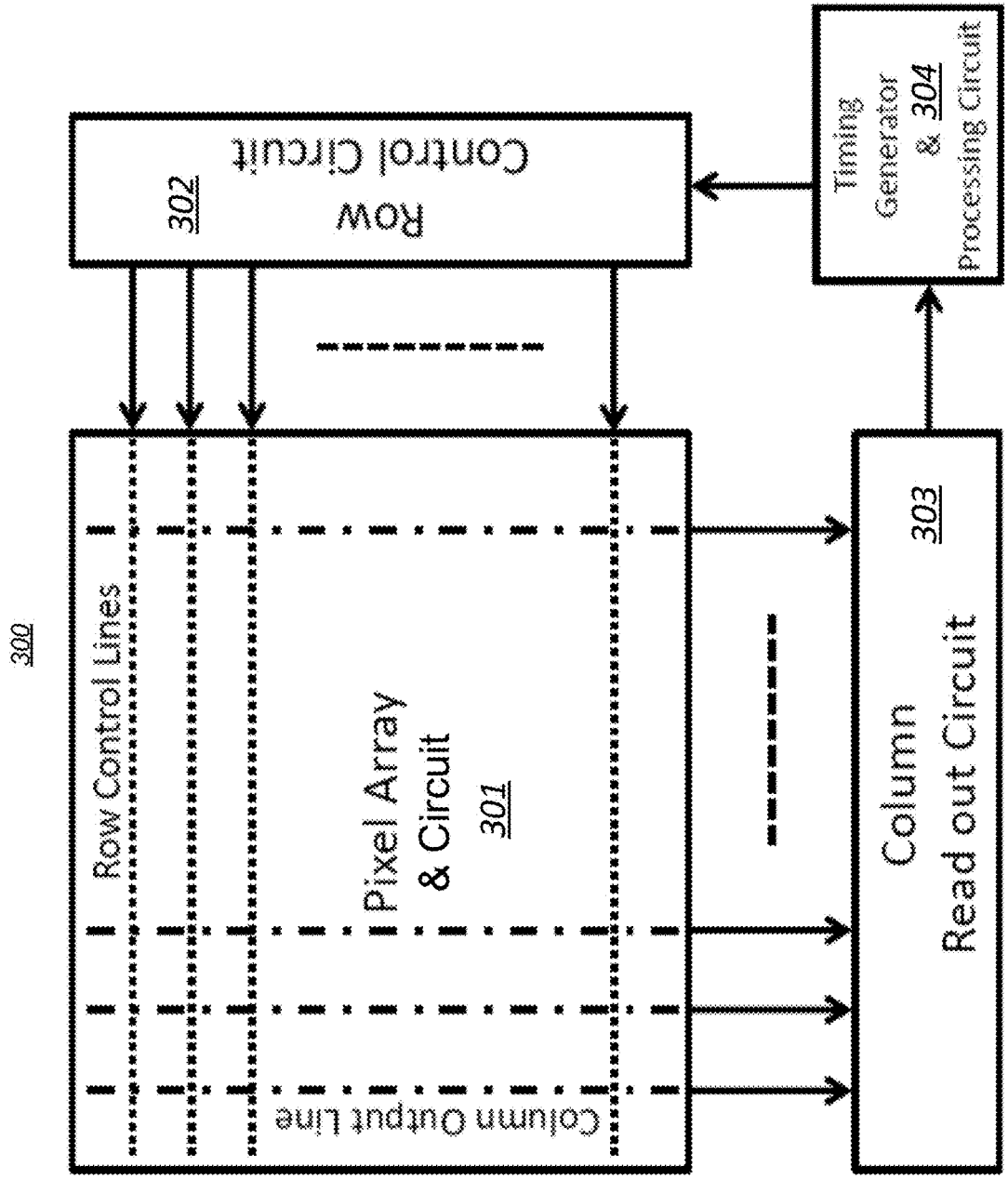
FIG. 3 is a schematic circuit diagram illustrating a HDR sensor system, consistent with exemplary embodiments of the present disclosure.

FIG. 3 is a schematic circuit diagram illustrating a HDR sensor system 300, consistent with exemplary embodiments of the present disclosure. The system 300 may comprise a pixel array and circuit 301, a row control circuit 302, a column readout circuit 303, and a timing generator and processing circuit 304. The pixel array and circuit 301 may comprise multiple pixels arranged by row and column and associated circuits, e.g., pixels shown in FIG. 1B and FIG. 2B. Each pixel row is coupled to row control circuit 302, and each pixel column is coupled to the column readout circuit 303. The row control circuit 302 may control readout timing in each row, and the column readout circuit 303 may receive pixel signals from each column. The timing generator and processing circuit 304 may control the row control circuit 302 and the column readout circuit 303 in terms of clock timing, signal processing, etc. The above circuit is merely exemplary, and other possible variations of circuit control may be implemented.

During one exemplary exposure of the photodiode sensor, the photodiodes in the pixel array and circuit 301 convert impinging photons into charges (e.g., electrons and/or holes). The charges are integrated (collected) in corresponding sensor sub-pixels or pixels. After the completion of integration cycle, collected charges are converted into voltages. The voltages are supplied to the output terminals and coupled to column readout circuit 303. In CMOS image sensors, the charge to voltage conversion is accomplished directly in the pixels themselves. The analog pixel voltage is transferred to the output terminals through various pixel addressing and scanning schemes controlled by the row control circuit 302. The analog signal can also be converted on-chip to a digital equivalent before reaching the chip output.

At the pixel level, corresponding portions of the row control circuit 302, the column readout circuit 303, and/or the timing generator and processing circuit 304 may be collectively deemed as "the circuit coupled to the plurality of photodiodes" described below with reference to FIG. 10.

Figure 4:
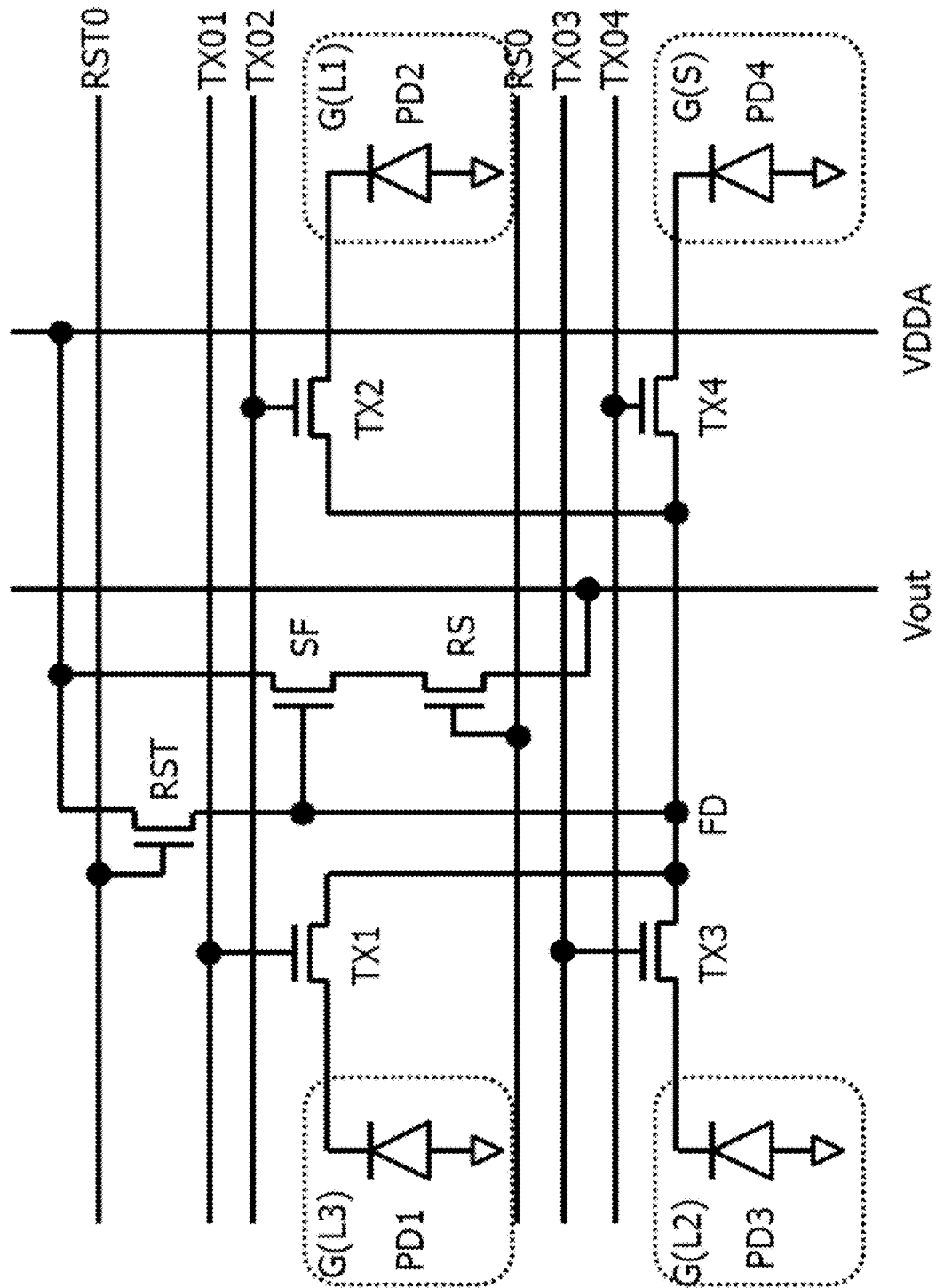
FIG. 4 is a circuit diagram illustrating a HDR sensor pixel with multiple sub-pixels and differential integration times, consistent with exemplary embodiments of the present disclosure.

FIG. 4 is a circuit diagram illustrating a HDR sensor pixel with multiple sub-pixels and differential integration times, consistent with exemplary embodiments of the present disclosure. The circuit diagram of FIG. 4 may correspond to a pixel in FIG. 2B described above.

As shown in FIG. 4, dash regions indicate the four photodiodes (PD1, PD2, PD3, and PD4) of the four sub-pixels, each associated with an integration time (L3, L2, L1, or S). Each of the photodiodes is coupled to a charge transferring (TX) transistor (TX1, TX2, TX3, or TX4), which may optionally operate in a pulsed integration mode. Each TX transistor is coupled to a TX control line (e.g. transistor TX1 is coupled to TX01). The row control circuit 302 may provide corresponding charge transfer control signals through TX01, TX02, TX03, and TX04 shown in FIG. 4, FIGS. 5B and 5C to the gate terminal of each charge transferring transistor TX1, TX2, TX3, and TX4. For example, a first charge transfer control signal TX01 may be provided to charge transferring transistor TX1, a second charge transfer control signal TX02 may be provided to charge transferring transistor TX2, a third charge transfer control signal TX03 may be provided to charge transferring transistor TX3, a fourth charge transfer control signal TX04 may be provided to charge transferring transistor TX4.

The four sub-pixels may share other circuit architectures. For example, the sensor pixel may incorporate a buffer amplifier, typically a source follower (SF) transistor, coupled to the TX transistors. The SF may couple to a sense line (Vout) through a suitable addressing transistor (also can be called a row select transistor RS). The TX transistors are also coupled to a charge detection node (FD) (also referred to as floating diffusion node or floating diffusion region). For example, one of the source or drain terminal of a TX transistor is coupled to the photodiode, and the other is coupled to node FD. As shown in FIG. 4, TX1 is coupled between photodiode PD1 and the node FD, TX2 is coupled between photodiode PD2 and the node FD, TX3 is coupled between photodiode PD3 and the node FD, and TX4 is coupled between photodiode PD4 and the node FD.

The charge detection node FD may be implemented using a region of doped semiconductor (e.g., a doped silicon region formed in a silicon substrate by ion implantation, impurity diffusion, or other doping techniques). The FD region exhibits a capacitance that can be used to detect the charges that has been transferred from photodiodes. The signal associated with the detected charges on FD is applied to the gate of source-follower transistor SF and conveyed to row select transistor RS by source-follower transistor SF.

The FD node is couple to a reset transistor (RST) that conductively couples the FD node to a voltage reference (VDDA). After the charge to voltage conversion as described above is completed and the resulting signal is transferred out from the sub-pixel/pixel through the sense line (Vout), the sub-pixels/pixel can be reset by the RST transistor for accumulation of new charge. In the example shown in FIG. 4, transistor RS is controlled via line RS0. Transistor RST is controlled via line RST0. This reset step removes collected charge, but may generate kTC-reset (thermal) noise. The kTC-reset noise is removed from the signal by the Correlated Double Sampling (CDS) signal processing technique in order to achieve the desired low noise performance. CMOS image sensors that utilize CDS usually require four transistors (4T) in the pixel, one of which serving as the charge transferring (TX) transistor. It is possible to share some of the pixel circuit transistors among several photodiodes to reduce the pixel size.

In some embodiments, the circuit depicted in FIG. 4 may be a part of the pixel array and circuit 301, vertical circuit lines such as Vout and VDDA may couple to the column readout circuit 303 of FIG. 3, and horizontal circuit lines such as RST0, RS0, TX01, TX02, TX03, and TX04 may couple to the row control circuit 302 of FIG. 3.

Figure 5A:
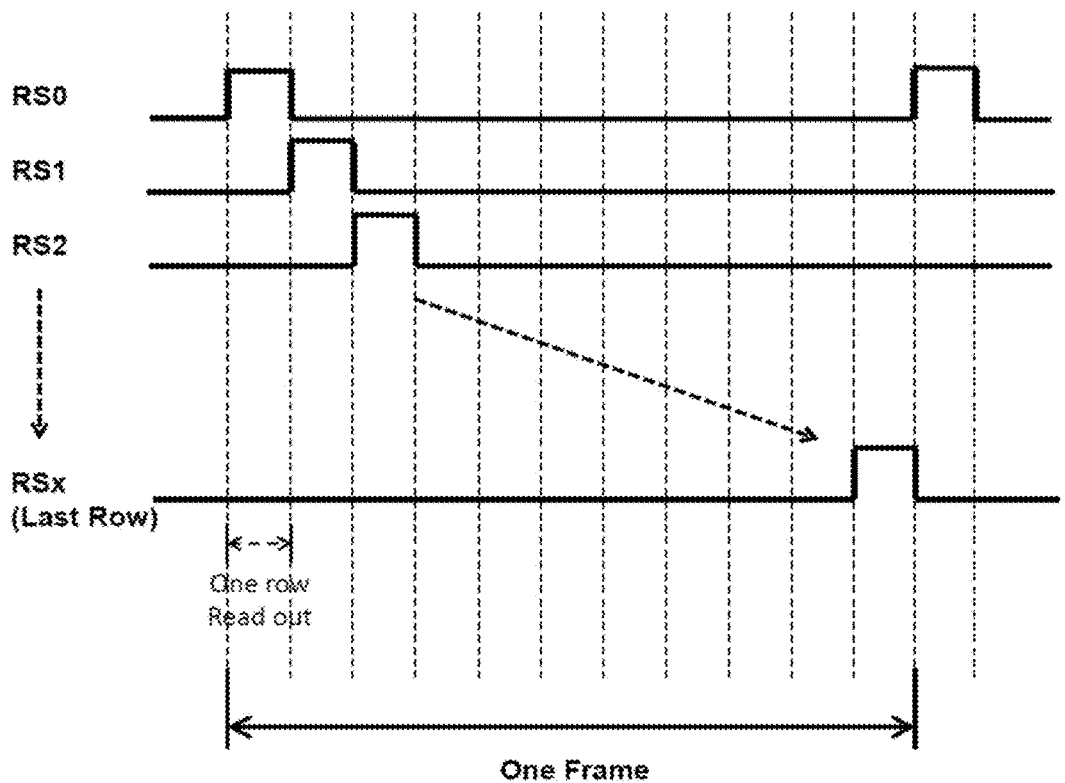
FIG. 5A is a graphical representation illustrating readout timing, consistent with exemplary embodiments of the present disclosure.

FIG. 5A is a graphical representation illustrating readout timing, consistent with exemplary embodiments of the present disclosure. In some embodiments, row addressing or selecting signals RS0, RS1, . . . and RSx each associates with a corresponding row and may indicate row control signals with respect to time. Such row control signals may be implemented by the row control circuit 302 in conjunction with timing generator & processing circuit 304 described above with reference to FIG. 3. Each control signal is represented by a pulse in the corresponding row. The pulse may indicate a voltage (high) with respect to the base line (low). The vertical dash lines indicate clock cycles. When the control signal is high (between two dash lines), it will turn on the row select transistors on that row, and column read out circuit 303 will read out the signals on the row. The rows are read out sequentially one after another from RS0 to RSx. Within one frame, every row is read out, so all signals captured by the sensor are read out. Then, the cycle may repeat for the next frame.

Figure 5B:
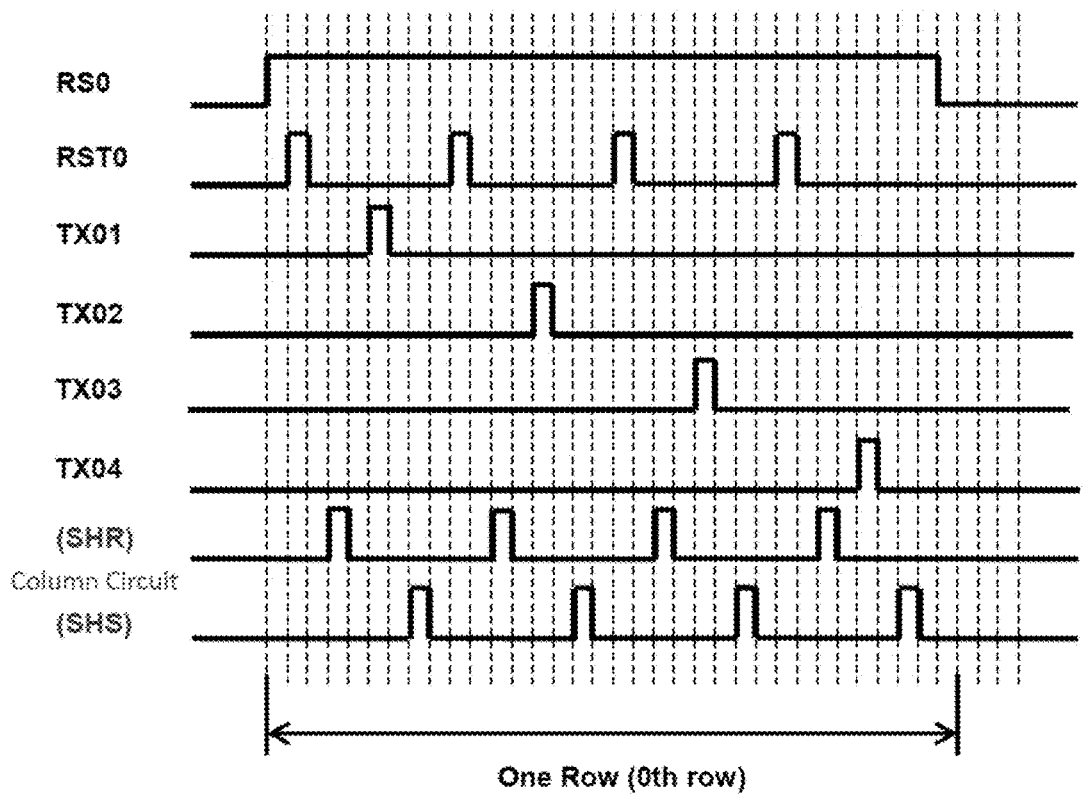
FIG. 5B is a graphical representation illustrating readout timing, consistent with exemplary embodiments of the present disclosure.

FIG. 5B is a graphical representation illustrating readout timing, consistent with exemplary embodiments of the present disclosure. In some embodiments, as shown in FIG. 5B and with reference to FIG. 4, various signal lines on the left may be pulsed with respect to time to read out photodiode signals. For example, as shown in FIG. 5, RS0 is mostly high, and RST0 is pulsed periodically, so that each of the TX01, TX02, TX03, and TX04 signals can be read out individually. For example, TX01, TX02, TX03, and TX04 signals may each be read out when RS0 is high and between two pulses of RST0. SHR (Sample and Hold Pixel Reset Signal) and SHS (Sample and Hold Pixel Signal) are signals provided by the column readout circuit 303 and configured to readout the photodiode signals. Before each TX reading as represented by pulses on TX time lines, SHR signal goes high to hold the reset signal, and after the TX reading, the SHS signal goes high to hold the photodiode signal. Such combination can ensure that the TX reading is properly reset and read out.

An exemplary timing diagram of a reading out time for $0^{th}$ row is described in detail below. When row select signal RS0 for the $0^{th}$ row is high, row select transistor RS is turned on, which enables that the charges on FD and applied on the gate of transistor SF be read out via Vout. In the beginning of this reading out period, the row control circuit 302 may provide the reset control signal RST0, which turns on the reset transistor RST, and resets the charge detection node FD to VDDA level voltage. After reset, the reset control signal RST0 may be deserted to turn off the reset transistor RST. After the reset process is complete, charge transferring transistor control signal or signals (e.g., TX01) may be asserted to turn on corresponding charge transferring transistors (e.g., TX1). When transfer transistors (e.g., TX1) are turned on, the charges that have been generated and integrated by the corresponding photodiodes (e.g., PD1) from the incoming light are transferred to shared charge detection node FD. As discussed above, row select transistor RS is turned on, the charges on FD and applied on gate of transistor SF can be read out via Vout. After PD1 is read, node FD can be reset, and when TX02 is on, PD2 can be read out. Same operations can be carried out for the other photodiodes. The charge transferring transistors (e.g., TX1, TX2, TX3, and TX4) may be pulsed once to perform one charge transfer operation or may be pulsed multiple times to perform multiple charge transfer operations. In a typical configuration, there are numerous rows and columns of image pixels in the pixel array shown in FIG. 3. When it is desired to read out the value of the detected charges (the value of the detected charges represented by the signal at the source of transistor SF, which is connected to node FD), row select control signals may be asserted, and corresponding image signals Vout that are representative of the magnitude of the charges on shared charge detection node FD (e.g., an image level voltage from one or more photodiodes PD1, PD2, PD3, and PD4) is produced on output Vout in FIG. 4.

Figure 5C:
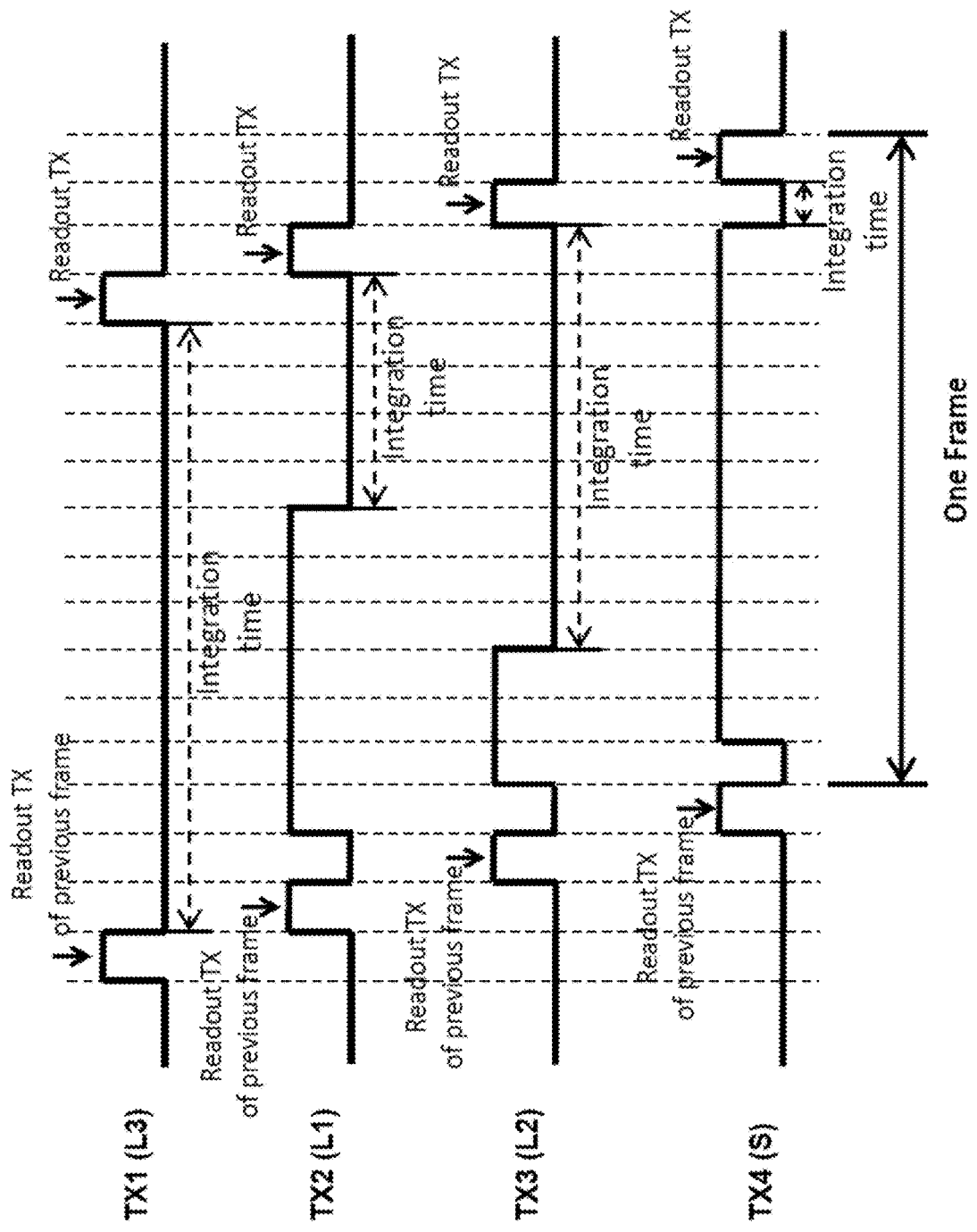
FIG. 5C is a graphical representation illustrating readout timing for the HDR sensor in FIG. 4 with four different integration times, consistent with exemplary embodiments of the present disclosure.

FIG. 5C is a graphical representation illustrating integration timing for the HDR sensor in FIG. 4 with four different integration times, consistent with exemplary embodiments of the present disclosure. FIG. 5C shows signal lines for four TX transistors with respect to time, corresponding to four photodiodes of one pixel and corresponding to integration times L3, L2, L1, and S described above. The TX transistors may operate in a pulsed integration mode to exhibit desired different integration times for HDR imaging. In this figure, the readout for each photodiode starts with the end of a previous TX readout pulse and ends with another TX readout pulse. Within that period, also known as a frame, each TX gate may be associated with an integration time, configurable via clock and timing by the circuits described in FIG. 3.

The voltage across each of the photodiodes and their readout times may be configured by pulses to the corresponding charge transferring transistor TX to set the integration times shown in FIG. 5C. In some embodiments, for example TX2(L1) in FIG. 5C, after the read out pulse (e.g., first pulse in FIG. 5C), the charge transferring transistor (e.g., TX2) can be turned on again by a high voltage on control line signal TX2(L1), and RST can be turned on again, and charges in the corresponding photodiode (e.g., PD2) are thrown out from the photodiode through the charge transferring transistor TX2 to FD and FD is reset to VDDA through reset transistor RST (referring to FIG. 4). When the charge transferring transistor (e.g., TX2) is low (turned off), charges are allowed to accumulate on the corresponding photodiode (e.g., PD2) for a period of time, shown in FIG. 5C as the integration time. When the control line signal TX2(L1) is pulsed, for example, the pulse at the end of line TX2(L1), the accumulated charges are transferred to node FD, and are read out via SF and RS transistors as the corresponding photodiode signal. The charge transferring transistors (e.g., TX1, TX2, TX3, and TX4) are controlled individually during one frame between a readout and a previous readout. Here, each photodiode in the pixel corresponding a charge transferring transistor has an integration time configurable by a corresponding charge transferring gate timing as shown in FIG. 5C. Each integration time may be set to any length. Thus, according to various integration times, the converted charges are different for each of the four photodiodes, achieving different exposure levels within the same pixel.

As shown above, integration times of four TXs can be controlled independently to achieve HDR imaging with four different integration times. In some embodiments, it is also possible to achieve three different integration times by setting two photodiodes to have the same integration times, or achieve two different integration times by setting two photodiodes to have the same integration time and setting the other two photodiodes to have another same integration time. Details are described below with reference to FIG. 5D and FIG. 5E. Such flexibility in integration time configuration can offer more imaging options. Also, the signal charges in the photodiodes can be combined into the FD node (binning) as described below with reference to FIG. 5F, FIG. 5G, and FIG. 5H. The binning method can increase the readout efficiency and signal to noise ratio.

Figure 5D:
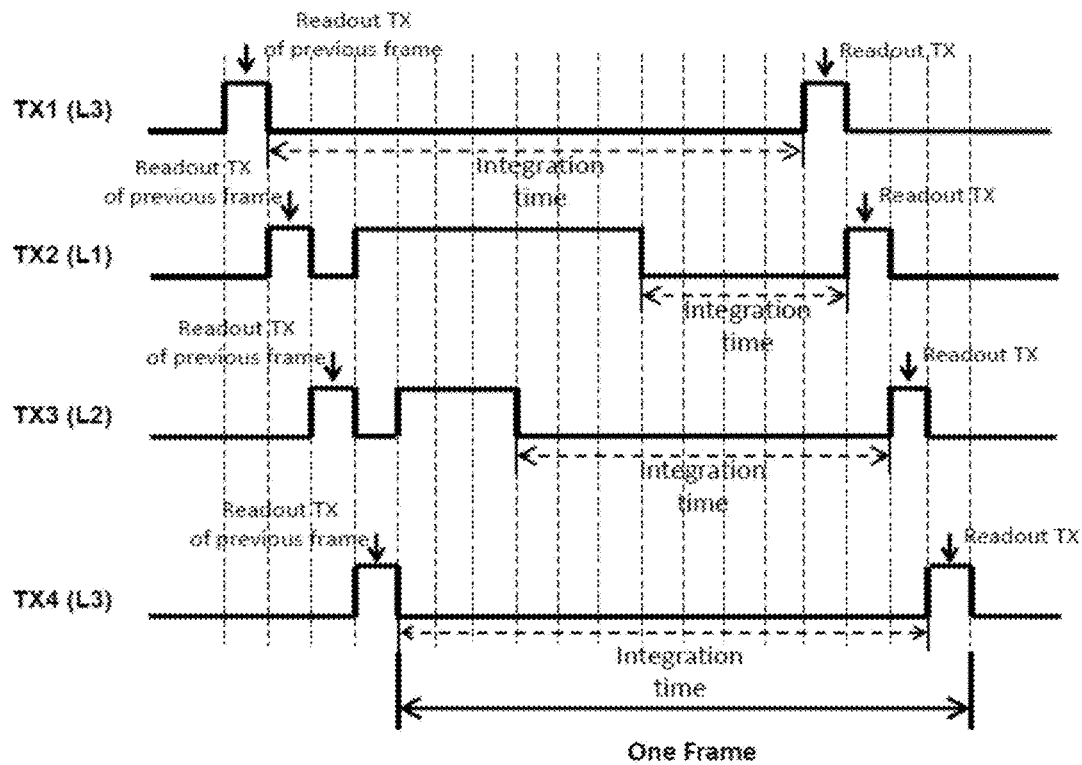
FIG. 5D is a graphical representation illustrating readout timing with three different integration times, consistent with exemplary embodiments of the present disclosure.

FIG. 5D is a graphical representation illustrating readout timing with three different integration times, consistent with exemplary embodiments of the present disclosure. FIG. 5D is similar to FIG. 5C except that the integration time length of the photodiode associated with TX4 is set to be the same as that of the photodiode associated with TX1 (both are L3). Thus, among the four photodiodes associated with TX1, TX2, TX3, and TX4, there are 3 different integration times (correspondingly, L3, L1, L2, and L3).

Figure 5E:
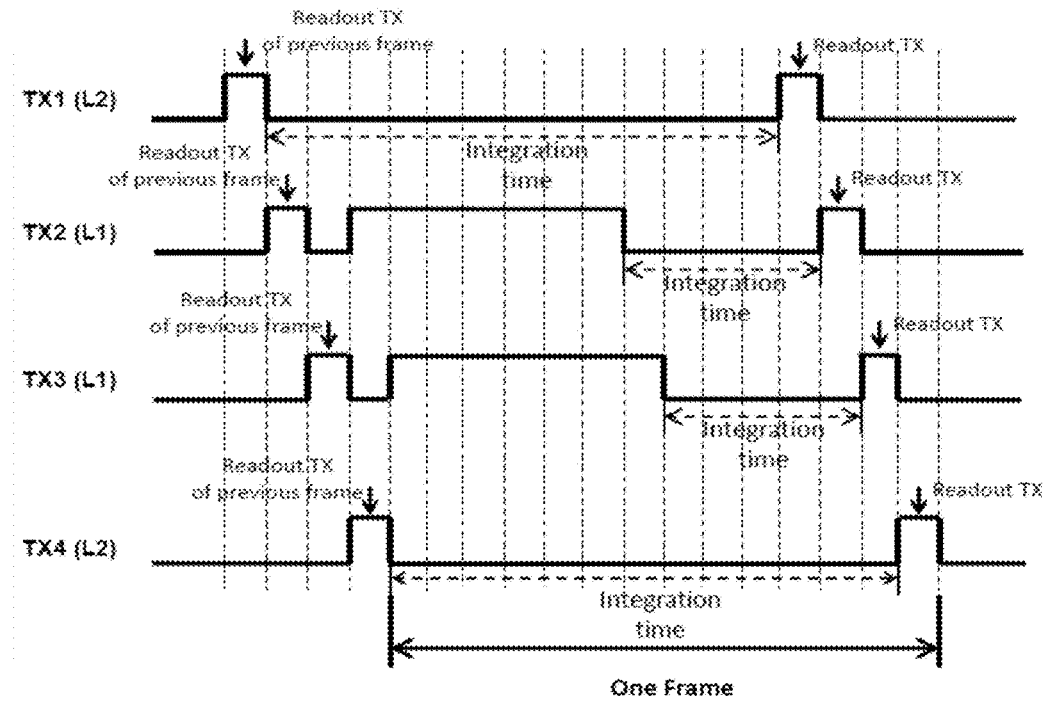
FIG. 5E is a graphical representation illustrating readout timing with two different integration times, consistent with exemplary embodiments of the present disclosure.

FIG. 5E is a graphical representation illustrating readout timing with two different integration times, consistent with exemplary embodiments of the present disclosure. FIG. 5E is similar to FIG. 5D except that the integration time length of the photodiode associated with TX3 is set to be the same as that of the photodiode associated with TX2 (both are L1). Thus, among the four photodiodes associated with TX1, TX2, TX3, and TX4, there are 2 different integration times (correspondingly, L2, L1, L1, and L2).

Figure 5F:
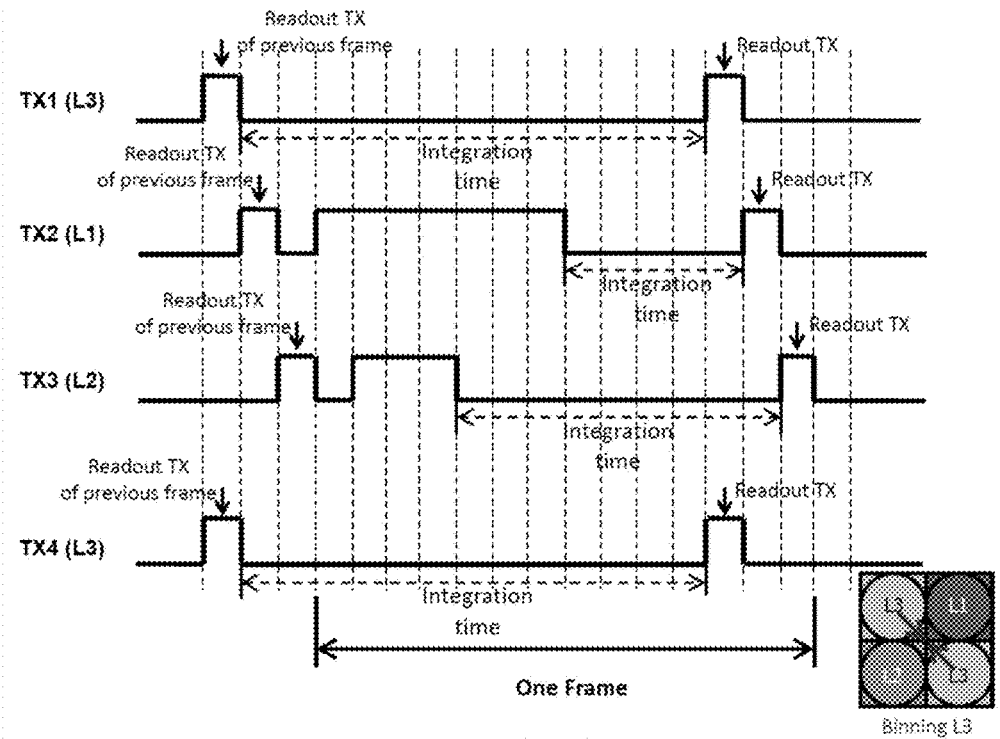
FIG. 5F is a graphical representation illustrating readout timing with three different integration times and binning, consistent with exemplary embodiments of the present disclosure.
Figure 5G:
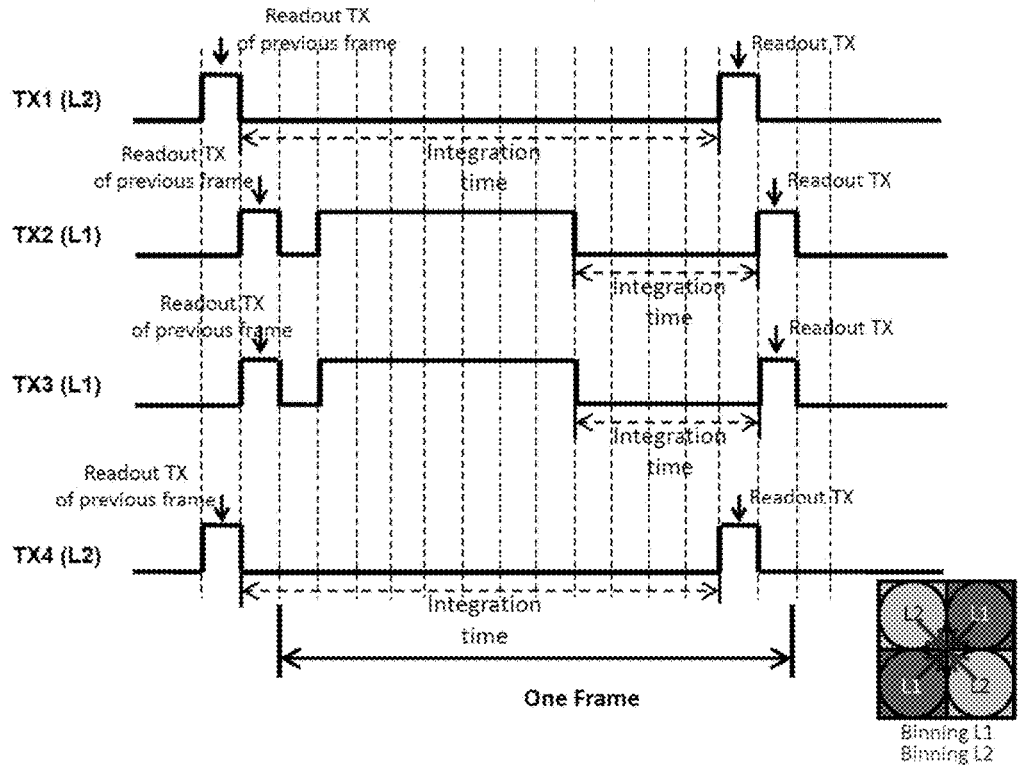
FIG. 5G is a graphical representation illustrating readout timing with two different integration times and binning, consistent with exemplary embodiments of the present disclosure.
Figure 5H:
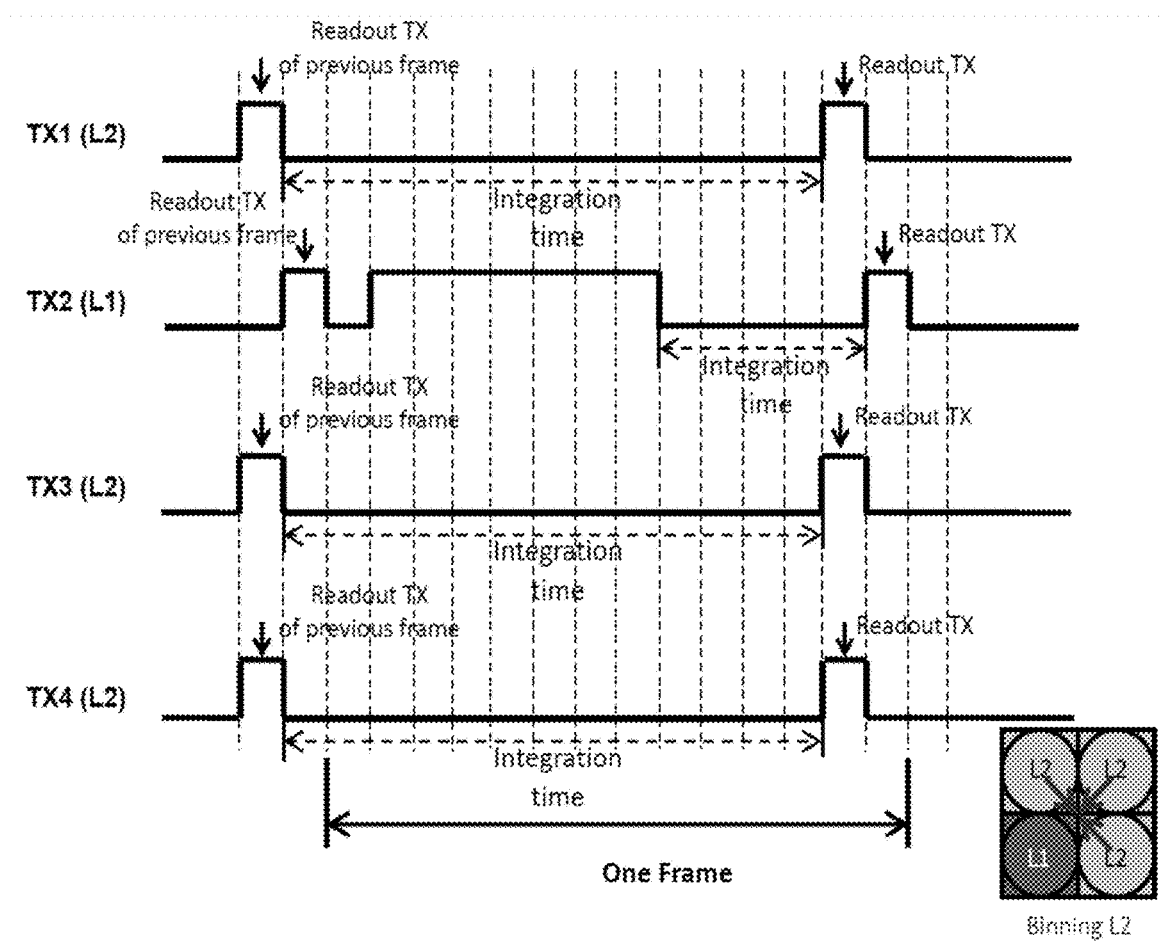
FIG. 5H is a graphical representation illustrating readout timing with two different integration times and binning, consistent with exemplary embodiments of the present disclosure.

FIG. 5F-5H below describe various binning methods, consistent with exemplary embodiments of the present disclosure. Any number of photodiode signals can be binned for readout, and one or more groups of binning can be implemented within each pixel. FIG. 5F is a graphical representation illustrating readout timing with three different integration times and binning, consistent with exemplary embodiments of the present disclosure. FIG. 5F is similar to FIG. 5D except that the integration time of the photodiode associated with TX4 is shifted to align in time with that of the photodiode associated with TX1. Thus, the photodiodes signals associated with TX1 and TX4, having the same integration time, can be combined into the FD node (binning) described in FIG. 4 and thus read out together. Correspondingly shown with arrows in the insert at the bottom right of FIG. 5F, signals from photodiode TX1(L3) and photodiode TX4(L3) can be binned (combined for readout). Signals from the other two photodiodes TX2(L1) and TX3(L2) are not binned with any other photodiode signal because of the difference in the integration time and read out time. Similarly, any two or more photodiodes within the same pixel can be binned for signal readout, if having the same integration time and read out time.

FIG. 5G is a graphical representation illustrating readout timing with two different integration times and binning, consistent with exemplary embodiments of the present disclosure. FIG. 5G is similar to FIG. 5E except that the integration time of the photodiode associated with TX4 is shifted to align in time with that of the photodiode associated with TX1, and that the integration time of the photodiode associated with TX3 is shifted to align in time with that of the photodiode associated with TX2. Thus, the photodiodes signals associated with TX1 and TX4, having the same integration time, can be combined into the FD node (binning) and thus read out together; photodiodes readings associated with TX2 and TX3, having the another same integration time, can be combined into another FD node (binning) and thus read out together. Correspondingly shown with darker and lighter arrows in the insert at the bottom right of FIG. 5G, respectively, signals from the photodiode associated with TX1(L2) and the photodiode associated with TX4(L2) can be binned, and signals from the photodiode associated with TX2(L1) and the photodiode associated with TX3(L1) can be binned.

FIG. 5H is a graphical representation illustrating readout timing with two different integration times and binning, consistent with exemplary embodiments of the present disclosure. As shown in FIG. 5H, the photodiodes associated with TX1, TX3, and TX4 have the same integration time L2, while the photodiode associated with TX2 has the integration time L1. Thus, the photodiodes signals associated with TX1, TX3, and TX4, having the same integration time, can be combined into the FD node (binning) and read out together. Correspondingly shown with arrows in the insert at the bottom right of FIG. 5G, signals from the photodiode associated with TX1(L2), the photodiode associated with TX3(L2), and the photodiode associated with TX4(L2) can be binned.

Figure 6B:
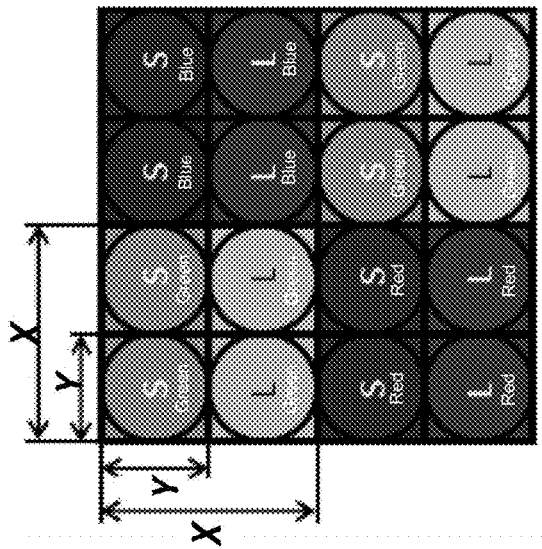
FIG. 6B is a graphical representation illustrating a Bayer unit of a Quadrant Pixel HDR sensor from both top and side views, consistent with exemplary embodiments of the present disclosure.
Figure 6B:
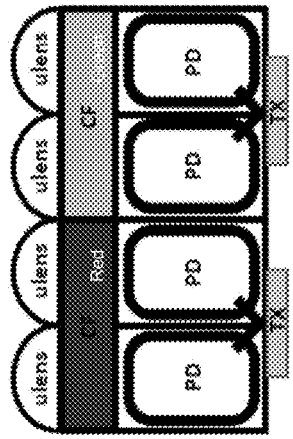
Figure 6A:
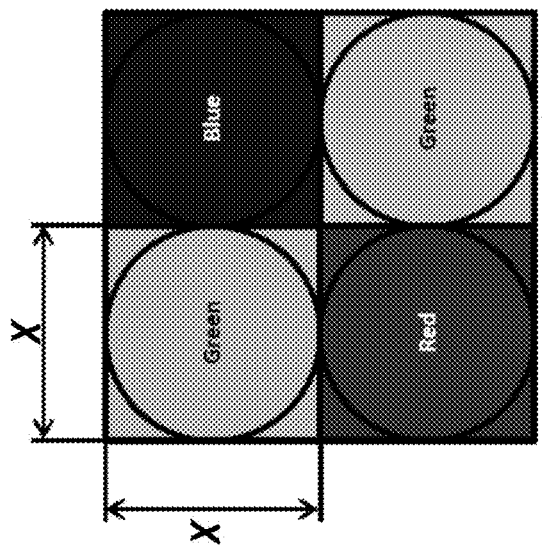
FIG. 6A is a graphical representation illustrating a Bayer unit of a sensor in prior art from both top and side views.
Figure 6A:
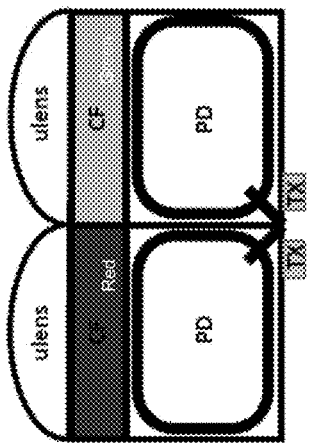

FIGS. 6A, 6B, and 7-9 below describe a simplified configuration with respect to the above-described HDR system to achieve two different integration times. FIG. 6A is the same as FIG. 1A and used for comparison with FIG. 6B. FIG. 6B is a graphical representation illustrating a Bayer unit of a Quadrant Pixel HDR sensor from both top and side views, consistent with exemplary embodiments of the present disclosure. FIG. 6B is mostly similar to FIG. 1B, except that in each pixel, two sub-pixels have a shorter integration time (S) and the other two have a longer integration time (L), and two photodiodes share a TX transistor. Thus, in each pixel, four photodiodes corresponding to four sub-pixels can be configured to two groups having different integration times. The grouping may be 2-2 or 1-3. Accordingly, in the side view, sub-pixels having the same integration time within a pixel may share the same TX transistor, for example, by connecting their individual TX transistors electrically with polysilicon or metal wire. Thus, their signals can be combined into a FD node together. Such structure may be simpler and easier to manufacture. Though this figure shows that two sub-pixels next to each other can be grouped and have the same integration time, it is also possible that two sub-pixels across the pixel are grouped to have the same integration time.

Figure 7:
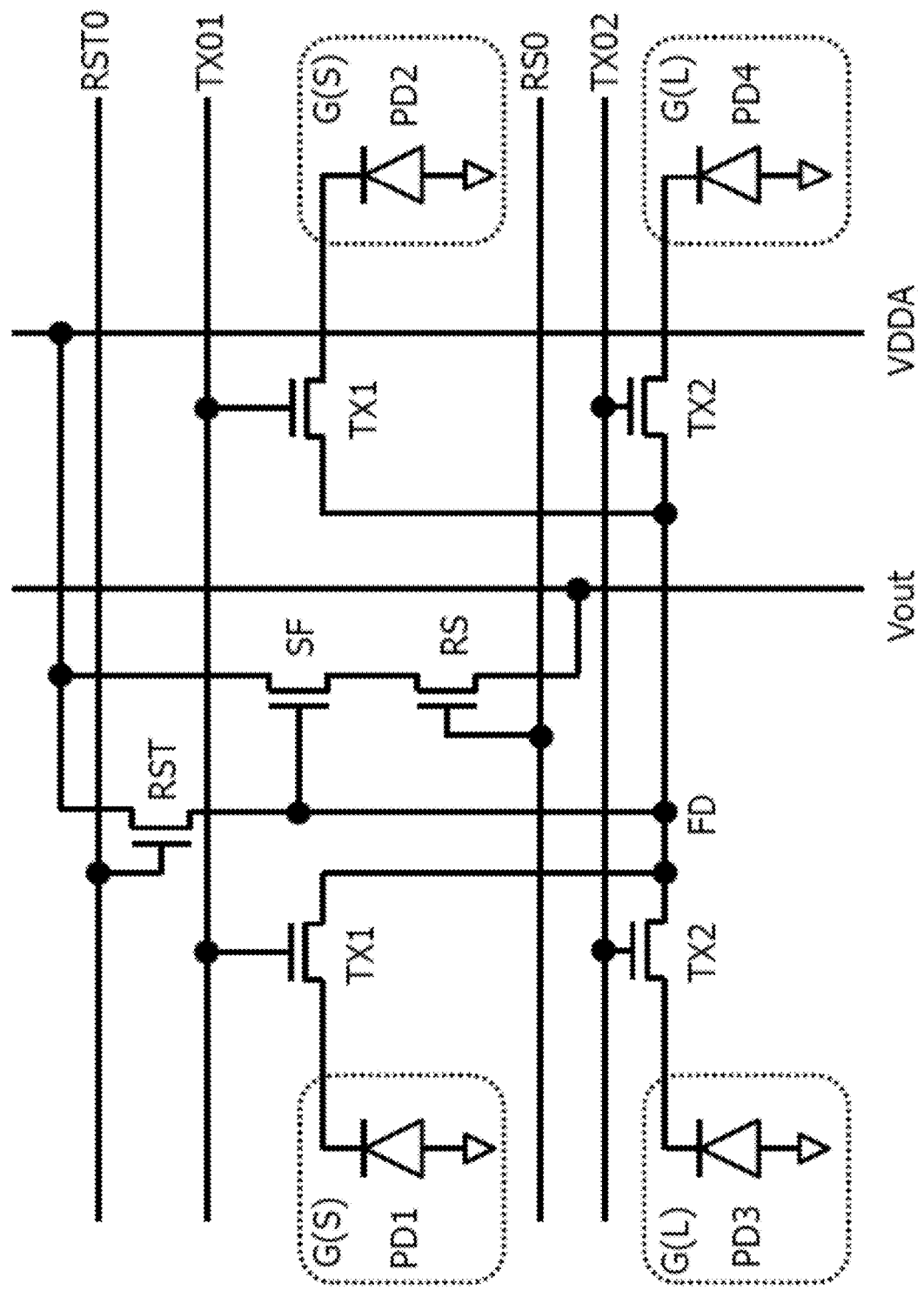
FIG. 7 is a circuit diagram illustrating a HDR sensor pixel with four sub-pixels and two different integration times, consistent with exemplary embodiments of the present disclosure.

FIG. 7 is a circuit diagram illustrating a HDR sensor pixel with four sub-pixels and two different integration times, consistent with exemplary embodiments of the present disclosure. FIG. 7 is similar to FIG. 4, except that two photodiodes have the same integration time S and their corresponding transistors TX1 are electrically connected and coupled to the same control line TX01, and the other two photodiodes have the same integration time L and their corresponding transistors TX2 are electrically connected and coupled to the same control line TX02. The working principles for the circuits in FIG. 7 are similar to the circuit in FIG. 4, except that the TX1s for PD1 and PD2 are controlled by one control line TX01 and TX2s for PD3 and PD4 are controlled by one control line TX02.

Figure 8:
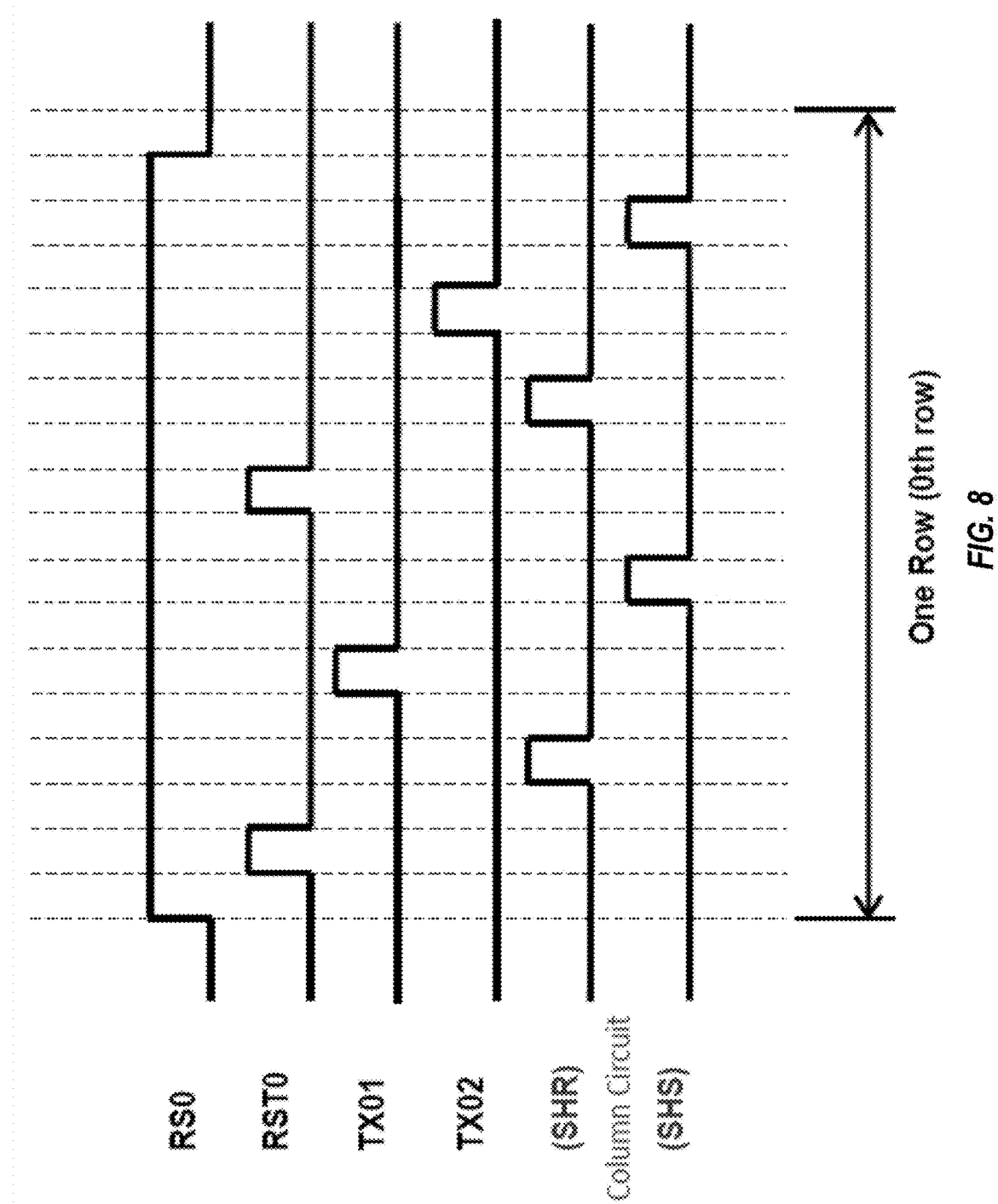
FIG. 8 is a graphical representation illustrating readout timing for the HDR sensor in FIG. 7, consistent with exemplary embodiments of the present disclosure.

FIG. 8 is a graphical representation illustrating readout timing for the HDR sensor in FIG. 7, consistent with exemplary embodiments of the present disclosure. FIG. 8 is similar to FIG. 5B except that only two photodiode signal lines corresponding to TX01 and TX02 are shown. The signals may be read out similarly as described above. The working principle shown in FIG. 8 is similar to that in FIG. 5B.

Figure 9:
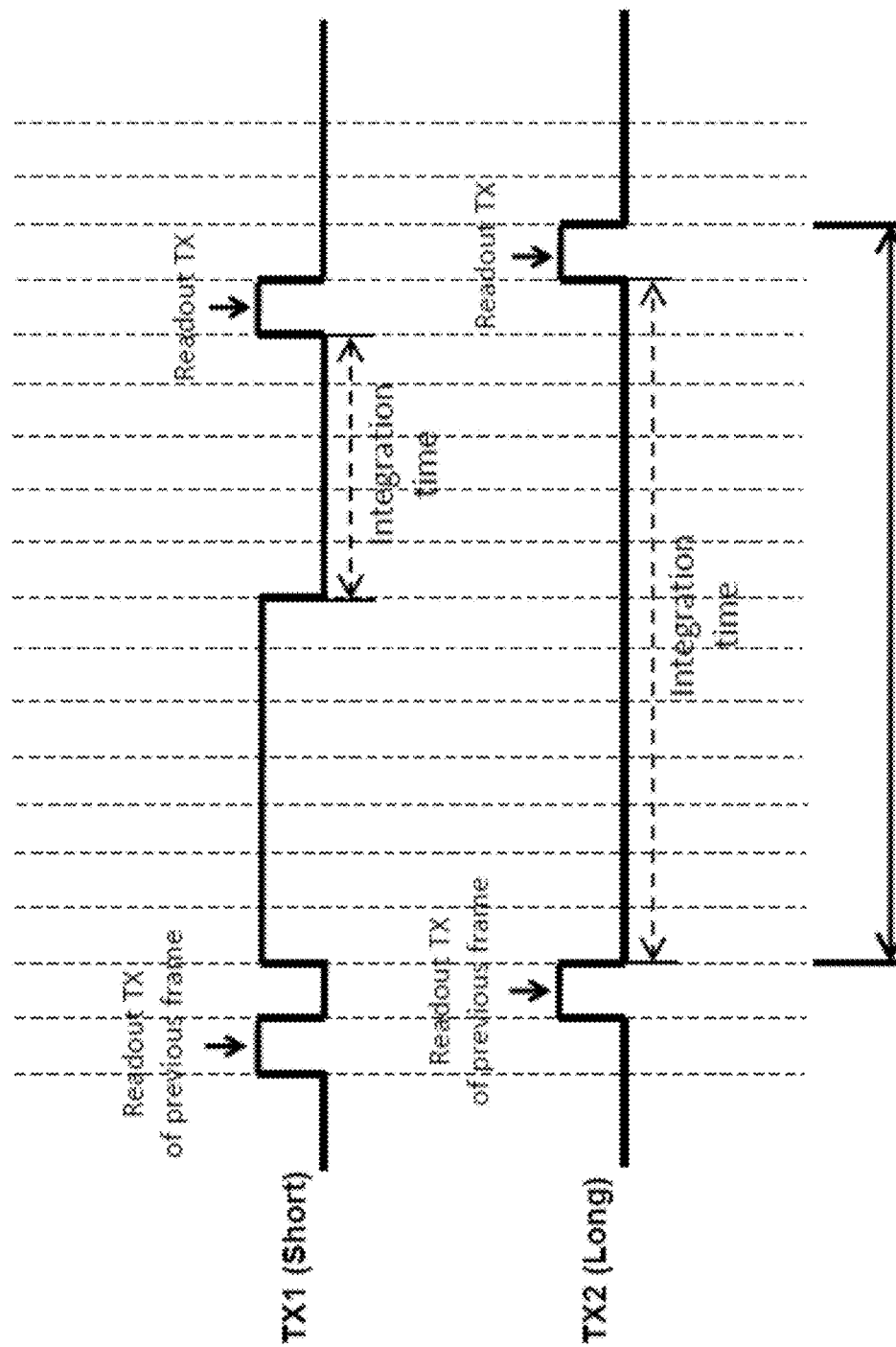
FIG. 9 is a graphical representation illustrating readout timing for the HDR sensor in FIG. 7 with two different integration times, consistent with exemplary embodiments of the present disclosure.

FIG. 9 is a graphical representation illustrating readout timing for the HDR sensor in FIG. 7 with two different integration times, consistent with exemplary embodiments of the present disclosure. FIG. 9 is similar to FIG. 5C except that only two different integration times corresponding TX01 and TX02 are shown. Thus, the two groups of photodiodes are each configured with an integration time to control the exposure levels. The working principle shown in FIG. 9 is similar to that in FIGS. 5C-5H.

Figure 10:
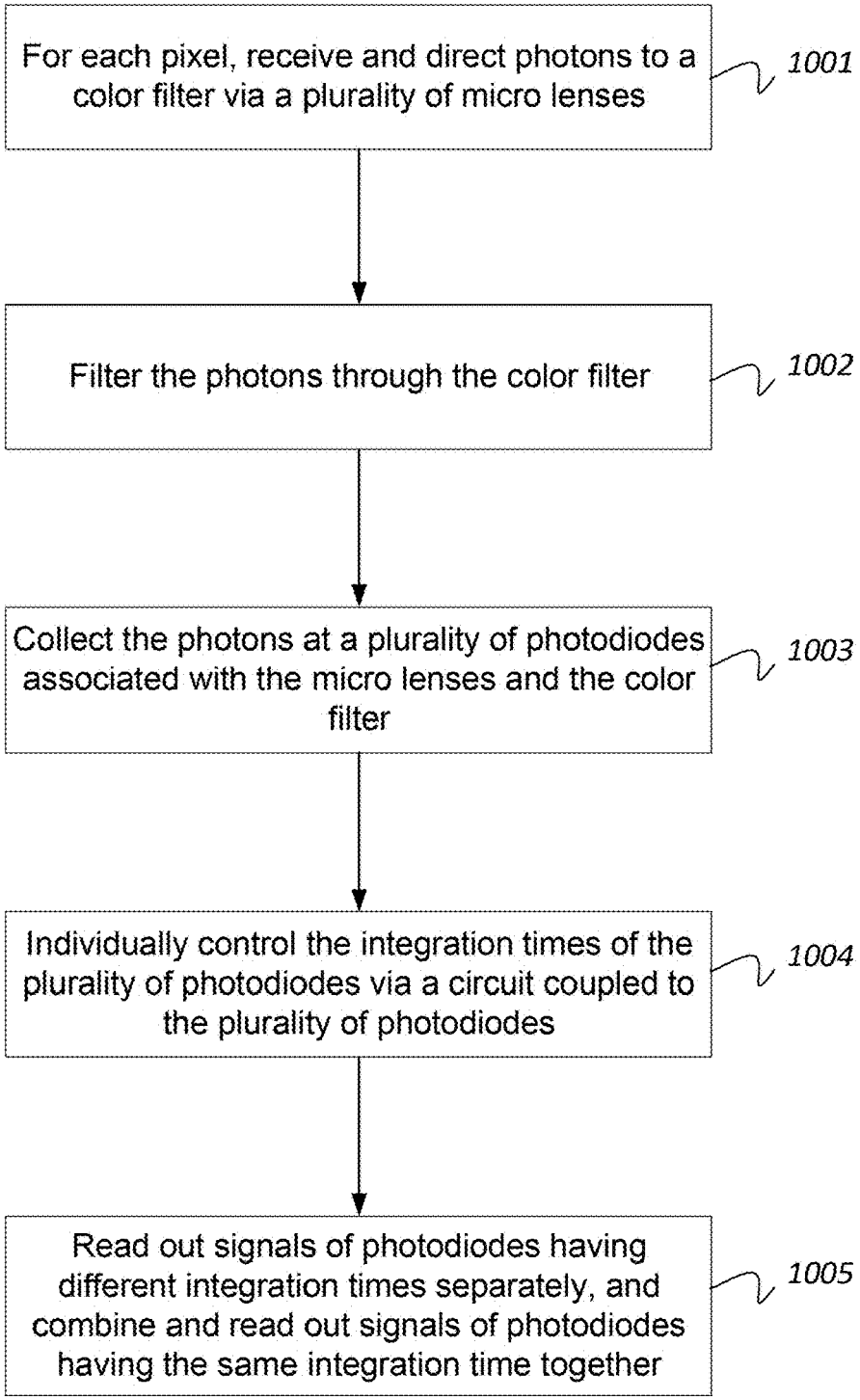
FIG. 10 is a flow diagram illustrating a method for HDR sensing, consistent with exemplary embodiments of the present disclosure.

FIG. 10 is a flow diagram illustrating a method 1000 for HDR sensing, consistent with exemplary embodiments of the present disclosure. The method 1000 may include a number of steps, some of which may be optional (e.g., steps 1001, 1004, and 1005). Method 1000 may be performed by the HDR sensing device or system described herein. As shown above, the sensing device may comprise an array of Bayer-pattern units of color filters, each of the color filters corresponding to a pixel of the sensing device, and each of the color filters overlapping with a plurality of photodiodes. Method 1000 may focus on describing steps with respect to a single pixel. Similarly, such steps may be performed on multiple pixels across a sensing device.

At step 1001, photons may be received and directed to a color filter via a plurality of micro lenses (e.g., four micro lenses arranged in a 2 by 2 configuration above color filter).

At step 1002, the photons may be filtered through the color filter.

At step 1003, the photons may be collected at a plurality of photodiodes associated with the micro lenses and the color filter (e.g., four photodiodes disposed below the color filter and substantially aligned with the four micro lenses respectively). Detailed configurations may be referred to FIG. 1B described above. The photons may be converted to charges and the charges accumulate at the photodiode.

At step 1004, the integration times of the plurality of photodiodes are individually controlled via a circuit coupled to the photodiodes. The circuit may be referred to FIG. 3, FIG. 4, and FIG. 7 above. In some embodiments, at least two of the integration times of the plurality of photodiodes in each pixel may be different. In some embodiments, with the structure shown in FIG. 1B, the four photodiodes in one pixel may each have different integration times. A user may also configure the circuit to have two, three, or four out of the four photodiodes in the one pixel to have the same integration time. In view of the disclosure, such configurations should be able to achieve by a person having ordinary skill in the art.

At step 1005, signals of the photodiodes having different integration times may be read out separately, and signals of photodiodes having the same integration time may be combined and read out together via the circuit.

The specification has described methods, apparatus, and systems for HDR sensing or imaging. As shown above, each pixel may comprise four sub-pixels to achieve 2-4 different integration times within the same pixel. Similarly, each pixel can be divided into n sub-pixels to achieve 1 to n different integration times, with n being any natural number and as long as the fabrication permits. The illustrated steps are set out to explain the exemplary embodiments shown, and it should be anticipated that ongoing technological development will change the manner in which particular functions are performed. Thus, these examples are presented herein for purposes of illustration, and not limitation. For example, steps or processes disclosed herein are not limited to being performed in the order described, but may be performed in any order, and some steps may be omitted, consistent with the disclosed embodiments. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments.

While examples and features of disclosed principles are described herein, modifications, adaptations, and other implementations are possible without departing from the spirit and scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

What is claimed is:

1. A sensing device, comprising:
   an array of Bayer-pattern units of color filters, each of the color filters corresponding to a pixel of the sensing device, and each of the color filters overlapping with a plurality of photodiodes; and
   a switch coupled to each of the photodiodes, wherein:
   the switch is configured to control a length of an integration time of the corresponding photodiode,
   signals of photodiodes in the same pixel and having different lengths of the integration time are read out separately in separate timing, and
   signals of photodiodes in the same pixel and having the same length of the integration time and the same read out timing are binned and read out together.

2. The sensing device of claim 1, wherein:
   each of the color filters overlapping with four photodiodes; and
   each of the four photodiodes corresponds to a sub-pixel of the pixel, each pixel corresponding to one of the color filters.

3. The sensing device of claim 2, further comprising four micro lenses respectively associated with the four photodiodes, wherein:
   the four photodiodes are disposed in a two by two configuration under the one color filter; and
   the four micro lenses are disposed in the same two by two configuration above the one color filter and each configured to direct impinging light to pass through the one color filter to reach the corresponding photodiode.

4. The sensing device of claim 1, wherein:
   each of the plurality of photodiodes is associated with an integration time; and
   at least two photodiodes of the plurality of photodiodes associated with one color filter have different integration times.

5. The sensing device of claim 4, further comprising a circuit coupled to the plurality of photodiodes, wherein each of the plurality of photodiodes is associated with at least a part of the circuit configured to control the corresponding integration time.

6. The sensing device of claim 4, wherein the integration time corresponds to time for the corresponding photodiode to collect charges caused by impinging photons.

7. The sensing device of claim 4, wherein the plurality of photodiodes comprise four photodiodes each associated with a different integration time.

8. A sensing device, comprising:
   an array of Bayer-pattern units of color filters, each of the color filters corresponding to a pixel of the sensing device, each pixel having a plurality of photodiodes; and
   a switch coupled to each of the photodiodes, wherein:
   the switch is configured to control a length of an integration time of the corresponding photodiode,
   signals of photodiodes in the same pixel and having different lengths of the integration time are read out separately in separate timing, and
   signals of photodiodes in the same pixel and having the same length of the integration time and the same read out timing are binned and read out together.

9. The sensing device of claim 8, wherein each pixel includes four photodiodes.

10. The sensing device of claim 8, further comprising a charge detection node, wherein the switch has one terminal coupled to the photodiode and another terminal coupled to the charge detection node.

11. The sensing device of claim 10, further comprising a source follower transistor having a gate coupled to the charge detection node.

12. The sensing device of claim 11, further comprising a row select transistor coupled to the source follower transistor, wherein when the row select transistor is turned on, the source follower transistor is connected to an output.

13. The sensing device of claim 8, wherein each pixel includes four photodiodes.

14. The sensing device of claim 13, wherein, for one pixel, each of the plurality of photodiodes is associated with an integration time, and at least two photodiodes of the four photodiodes have different integration times.

15. The sensing device of claim 13, wherein, for one pixel, each of switches coupled to one of the photodiodes is coupled to a control line for individually control of the integration time of the coupled photodiode.

16. A high dynamic range sensing system, comprising:
    an array of Bayer-pattern units of color filters, each of the color filters corresponding to a pixel of the sensing system; and
    for each pixel:
    a plurality of micro lenses each disposed above one of the color filters and each configured to direct photons to pass the one of the color filters;
    a plurality of photodiodes each disposed below the one of the color filters and each configured to correspondingly receive the photons directed by the plurality of micro lenses and filtered through the one of the color filters; and
    a switch coupled to each of the photodiodes, wherein:
    the switch is configured to control a length of an integration time of the corresponding photodiode,
    signals of photodiodes in the same pixel and having different lengths of the integration time are read out separately in separate timing, and
    signals of photodiodes in the same pixel and having the same length of the integration time and the same read out timing are binned and read out together.

17. The high dynamic range sensing system of claim 16, wherein:
    the plurality of micro lenses include four micro lenses;
    the plurality of photodiodes include four photodiodes; and
    at least two of the integration times are different.

* * * * *